(12) United States Patent
Huang et al.

(10) Patent No.: US 11,540,417 B2
(45) Date of Patent: Dec. 27, 2022

(54) SOUNDING DEVICE AND MOBILE TERMINAL

(71) Applicant: AAC Technologies Pte. Ltd., Singapore (SG)

(72) Inventors: Xingzhi Huang, Shenzhen (CN); Lin Liu, Shenzhen (CN); Dijiang Tong, Shenzhen (CN); Zhe Zhang, Shenzhen (CN); Jun Wu, Shenzhen (CN); Zhichen Chen, Shenzhen (CN); Zhaoyu Yin, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 249 days.

(21) Appl. No.: 16/995,837

(22) Filed: Aug. 18, 2020

(65) Prior Publication Data
US 2021/0051816 A1 Feb. 18, 2021

Related U.S. Application Data

(63) Continuation of application No. PCT/CN2019/104832, filed on Sep. 9, 2019.

(30) Foreign Application Priority Data

Aug. 14, 2019 (CN) .......................... 201910748007.4

(51) Int. Cl.
*H05K 7/20* (2006.01)
*G06F 1/20* (2006.01)
(Continued)

(52) U.S. Cl.
CPC ......... *H05K 7/20145* (2013.01); *G06F 1/203* (2013.01); *H04M 1/0202* (2013.01); *H04R 1/2834* (2013.01)

(58) Field of Classification Search
CPC .... F04B 43/046; F04B 43/028; F04B 45/045; H04R 1/025; H04R 1/2819;
(Continued)

(56) References Cited

U.S. PATENT DOCUMENTS 5,850,460 A * 12/1998 Tanaka ................ H04R 1/2834
381/186
7,553,135 B2 * 6/2009 Cho ...................... F04B 45/045
417/322

(Continued)

FOREIGN PATENT DOCUMENTS

CN 104819315 A * 8/2015 ........... F16K 25/005

*Primary Examiner* — Michael A Matey
(74) *Attorney, Agent, or Firm* — W&G Law Group

(57) ABSTRACT

The invention provides a sounding device. The sounding device comprises a housing body with an accommodating space, a one-way inlet valve and a one-way outlet valve. A speaker unit partitions the accommodating space into a front cavity and a back cavity. The one-way inlet valve communicates the outside and the back cavity and is used for introducing air into the back cavity. The one-way outlet valve communicates the back cavity and the outside and is used for discharging the air in the back cavity outside. A first through hole communicating the outside and the back cavity is formed in the housing body. The invention also provides a mobile terminal. Compared with the related art, the sounding device and the mobile terminal of the invention have better reliability and better performance.

12 Claims, 4 Drawing Sheets

(51) Int. Cl.
   *H04M 1/02*   (2006.01)
   *H04R 1/28*   (2006.01)

(58) Field of Classification Search
   CPC ...... H04R 2499/11; H04R 9/022; H04R 1/02;
       H04R 1/023; H04R 1/2826; H04R
       1/2823; H04R 1/1075; H04R 1/2807;
       H04R 1/2811; H04R 1/2896; H04R
       11/02; H04R 25/65; H04R 9/06; H04R
       1/2834; H05K 7/20; H05K 7/20145;
       G06F 1/203; H04M 1/0202
   See application file for complete search history.

(56) References Cited

U.S. PATENT DOCUMENTS

| | | | | |
|---|---|---|---|---|
| 7,972,124 | B2 * | 7/2011 | Hirata | F04B 45/047 |
| | | | | 417/413.2 |
| 8,081,454 | B2 * | 12/2011 | Ishikawa | H05K 7/20172 |
| | | | | 165/122 |
| 10,045,461 | B1 * | 8/2018 | Boozer | H04R 1/00 |
| 10,613,594 | B2 * | 4/2020 | Cheng | H04R 1/025 |
| 10,932,069 | B2 * | 2/2021 | Jones | H04R 25/604 |
| 2002/0076062 | A1 * | 6/2002 | Juszkiewicz | H04R 5/02 |
| | | | | 381/345 |
| 2004/0196999 | A1 * | 10/2004 | Han | H04R 1/2819 |
| | | | | 381/345 |
| 2004/0253995 | A1 * | 12/2004 | Matsumoto | H04M 1/03 |
| | | | | 455/575.1 |
| 2005/0211498 | A1 * | 9/2005 | Osada | H04R 9/022 |
| | | | | 181/156 |
| 2006/0232167 | A1 * | 10/2006 | Jordan | H01L 41/25 |
| | | | | 310/324 |
| 2009/0245563 | A1 * | 10/2009 | Parker | H04R 9/022 |
| | | | | 381/345 |
| 2010/0183180 | A1 * | 7/2010 | Tsai | H04R 1/2826 |
| | | | | 381/345 |
| 2010/0183185 | A1 * | 7/2010 | Tsai | H04R 1/2853 |
| | | | | 381/386 |
| 2015/0109732 | A1 * | 4/2015 | Akif | H05K 7/20136 |
| | | | | 417/413.2 |
| 2016/0025429 | A1 * | 1/2016 | Muir | F04D 33/00 |
| | | | | 318/116 |
| 2019/0014407 | A1 * | 1/2019 | Qin | H04R 1/2888 |
| 2019/0342644 | A1 * | 11/2019 | Chen | H04R 1/288 |
| 2019/0394556 | A1 * | 12/2019 | Dory | H04R 1/1075 |
| 2020/0045415 | A1 * | 2/2020 | Wu | H04R 1/2873 |

* cited by examiner

SOUNDING DEVICE AND MOBILE TERMINAL

FIELD OF THE PRESENT DISCLOSURE

The invention relates to electroacoustic transducers, in particular to a portable sounding device and a mobile terminal with heat dissipation function.

DESCRIPTION OF RELATED ART

With the advent of the mobile Internet era, the number of smart mobile terminals is increasing continuously. Among many mobile devices, mobile phone is undoubtedly the most common and portable mobile terminal.

At present, the functions of mobile phones are extremely diverse, and with the higher requirements of mobile phone performance, the internal components of mobile phones are increasing.

However, in the mobile terminal in the related art, addition of components therein causes an increase of generated internal heat, moreover, each component has a single function, for example, a sounding device is used for sounding only, but overtemperature of the mobile phone is caused by multiple components to affect the functionality and stability thereof.

SUMMARY OF THE INVENTION

One object of the invention is to provide a sounding device with improved heat dissipation performance.

Accordingly, the present invention provides a sounding device, comprising:

a housing body with an accommodating space;

a speaker unit accommodated in the accommodating space;

a one-way inlet valve and a one-way outlet valve fixed on the housing body; wherein the speaker unit comprises a diaphragm for partitioning the accommodating space into a front cavity and a back cavity;

the one-way inlet valve communicates the outside and the back cavity for introducing air into the back cavity when the volume of the back cavity is increased through vibration of the diaphragm;

the one-way outlet valve communicates the back cavity and the outside for discharging the air in the back cavity outside when the volume of the back cavity is reduced through the vibration of the diaphragm.

Further, a first through hole communicating the outside and the back cavity is formed in the housing body; the one-way inlet valve comprises a first bracket fixed at an inner side of the housing body and completely covering the first through hole, and a first diaphragm attached to one side, far away from the first through hole, of the first bracket;

the first bracket comprises a first bracket body fixed at the inner side of the housing body, and a first air channel and second air channels penetrating through the first bracket body respectively; the first air channel communicates with the first through hole; the second air channels are arranged around the first air channel at intervals; the second air channels extend to the periphery of the first bracket body and communicate with the back cavity;

the first diaphragm comprises a first vibration part capable of moving up and down relative to the first bracket body and defining an intake space together with the first bracket body when moving to be spaced apart from the first bracket body, a first folded ring part extending from the periphery of the first vibration part, and a first fixation part diffusing and extending outwards from one end, far away from the first vibration part, of the first folded ring part; the first fixation part is attached to and fixed on the first bracket body and covers one part of the second air channels; the first fixation part, the second air channels and the housing body cooperatively define an air inlet passage communicating the back cavity and the intake space; and the first air channel communicates the intake space and the first through hole.

Further, a cross section of the first folded ring part is of an arc-shaped structure depressed in a direction far away from the first bracket body.

Further, an orthographic projection of the first folded ring part in the direction of the first bracket body partially falls into the second air channels.

Further, the first vibration part is arranged directly opposite to the first air channel; the first air channel is arranged directly opposite to the first through hole; and fourth second air channels are included and are arranged at equal intervals.

Further, the one-way inlet valve further comprises a first breathable member fixed at an outer side of the housing body; and the first breathable member completely covers the first through hole.

Further, a second through hole communicating the outside and the back cavity is also formed in the housing body; the one-way outlet valve comprises a second bracket fixed at the outer side of the housing body and completely covering the second through hole, and a second diaphragm attached to one side, far away from the second through hole, of the second bracket; the second bracket comprises a second bracket body fixed at the outer side of the housing body, and a third air channel and fourth air channels penetrating through the second bracket body respectively; the third air channel communicates with the second through hole; the fourth air channels are arranged around the third air channel at intervals; the fourth air channels extend to the periphery of the second bracket body and communicate with the outside; the second diaphragm comprises a second vibration part capable of moving up and down relative to the second bracket body and defining an exhale space together with the second bracket body when moving to be spaced apart from the second bracket body, a second folded ring part extending from the periphery of the second vibration part, and a second fixation part diffusing and extending outwards from one end, far away from the second vibration part, of the second folded ring part; the second fixation part is attached to and fixed on the periphery of the second bracket body and covers one part of the fourth air channels; the second fixation part, the fourth air channels and the housing body cooperatively define an air outlet passage communicating the exhale space and the outside; and the third air channel communicates the exhale space and the second through hole.

Further, the cross section of the second folded ring part is of an arc-shaped structure depressed in the direction far away from the second bracket body.

Further, the orthographic projection of the second folded ring part in the direction of the second bracket body partially falls into the fourth air channels.

Further, the second vibration part is arranged directly opposite to the third air channel; the third air channel is arranged directly opposite to the second through hole; and four fourth air channels are included and are arranged at equal intervals.

Further, the one-way outlet valve further comprises a second breathable member fixed at the inner side of the housing body; and the second breathable member completely covers the second through hole.

Further, the housing body comprises an upper cover and a lower cover covering the upper cover and defining the accommodating space together with the upper cover; the speaker unit and the upper cover define the front cavity; the speaker unit, the upper cover and the lower cover cooperatively define the back cavity; the first through hole is formed in the upper cover; and the second through hole is formed in the lower cover.

The invention further provides a mobile terminal, comprising a housing with a containment space and a sounding device as described above assembled in the housing, wherein an air inlet and an air outlet, which penetrate through the housing and separately communicate the containment space and the outside are formed in the housing; the one-way inlet valve communicates the containment space and the back cavity; and the one-way outlet valve communicates the back cavity and the air outlet.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The technical scheme in the embodiment of the present invention will be described clearly and completely in the following with reference to the accompanying drawings, and it's obvious that the embodiment described is only a part of the embodiments of the invention, and not all the embodiments. Based on the embodiment of the present invention, all other embodiments obtained by a person of ordinary skill in the art without creative labor are within the scope of the present invention.

Figure 1:
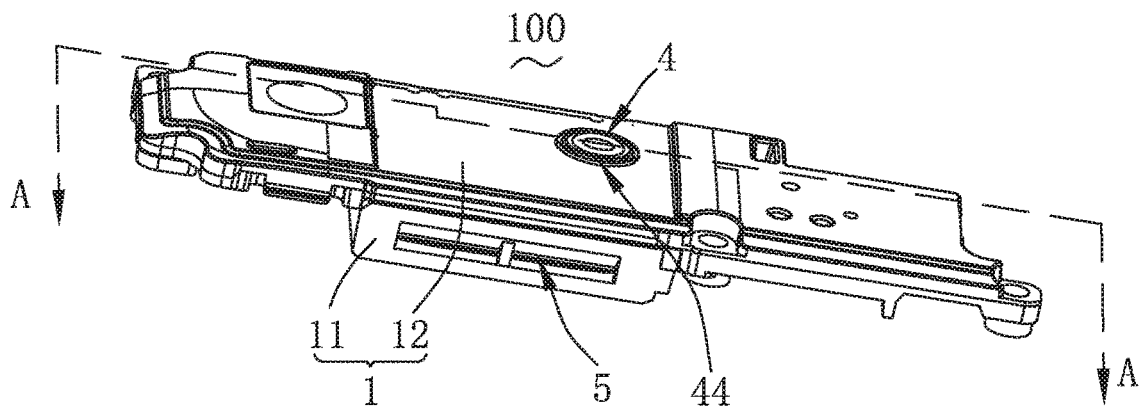
FIG. 1 is a isometric view of a sounding device of the present invention.
Figure 2:
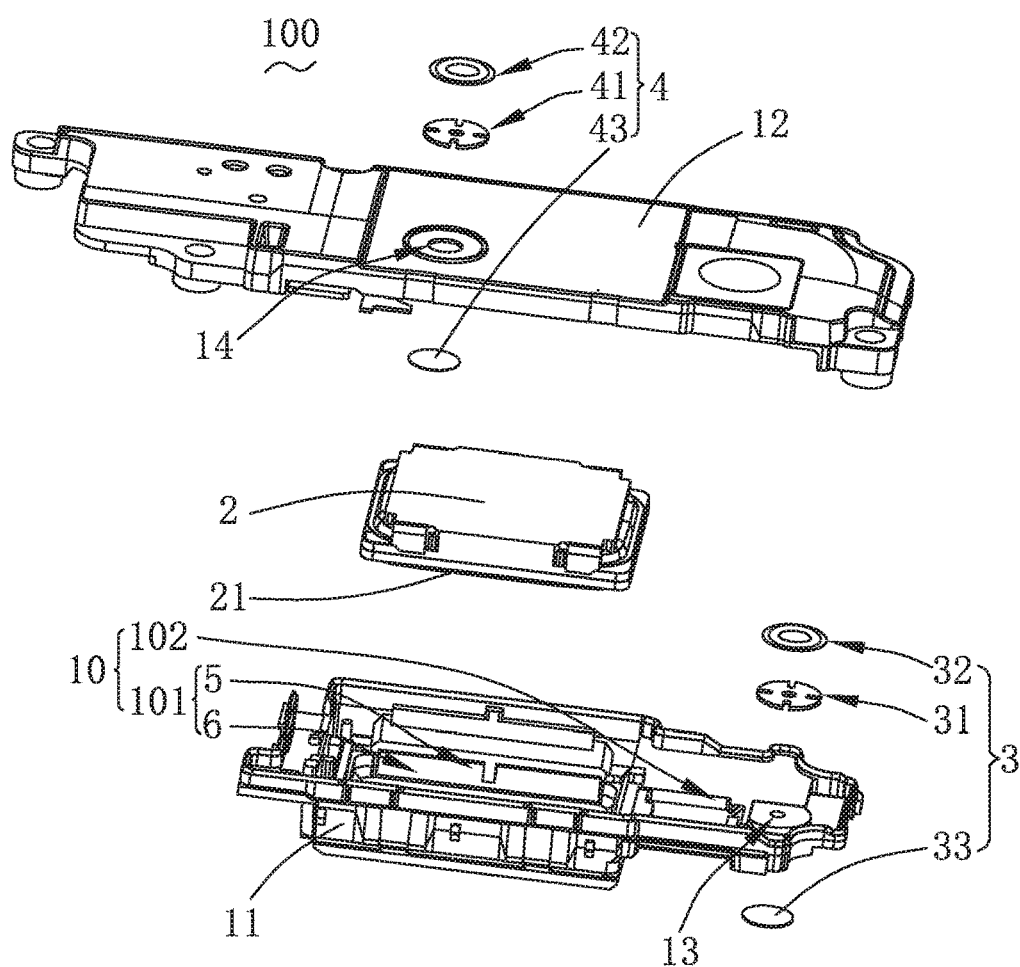
FIG. 2 is an exploded view of the sounding device.
Figure 3:
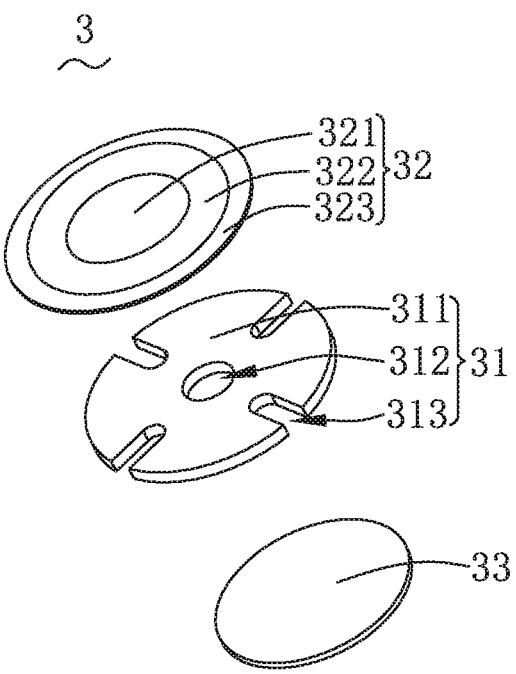
FIG. 3 is a partially exploded view of a one-way inlet valve of the sounding device of the invention.
Figure 4:
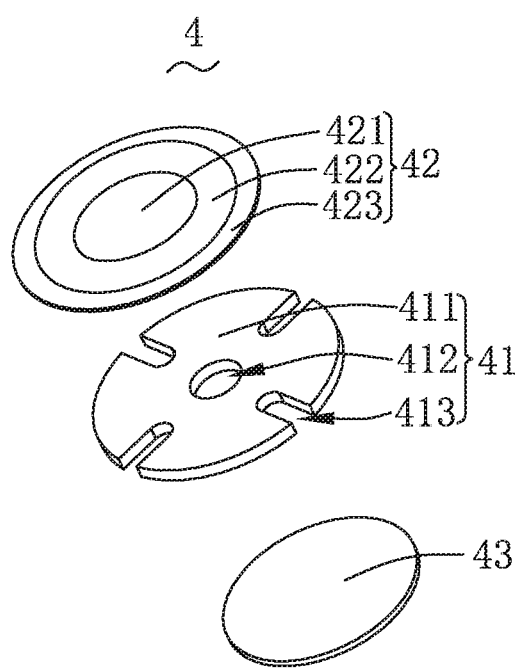
FIG. 4 is another partially exploded view of a one-way outlet valve of the sounding device of the invention.
Figure 5:
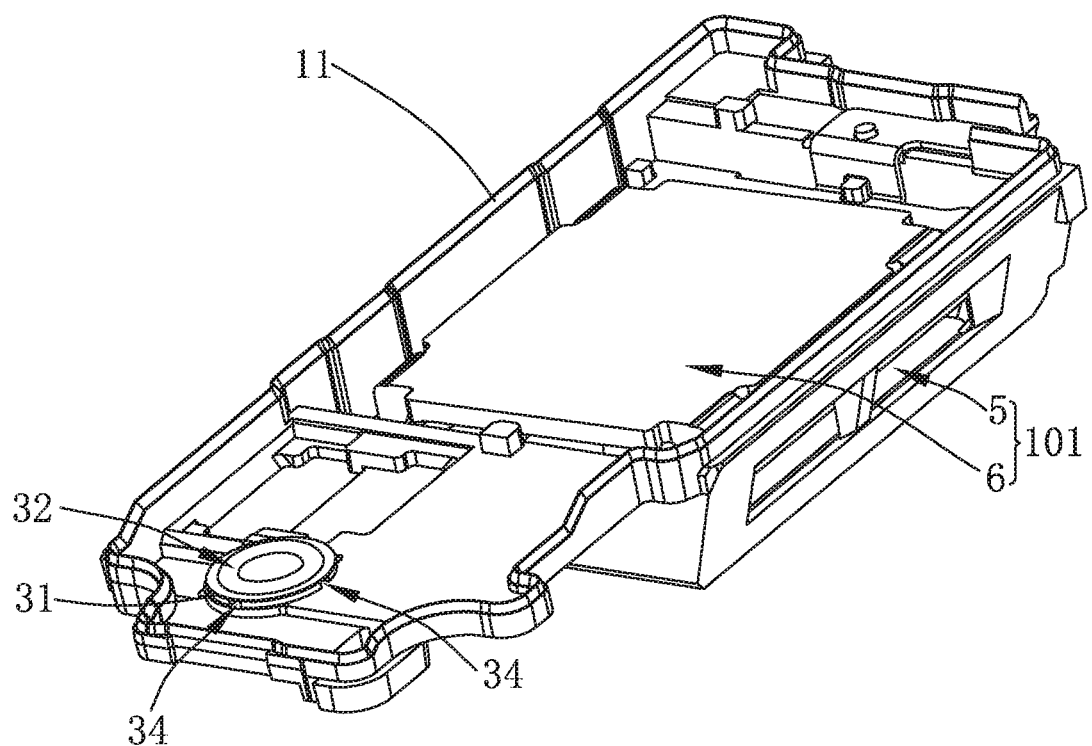
FIG. 5 is an isometric view of the one-way inlet valve and a housing body of the sounding device of the invention during assembly.
Figure 6:
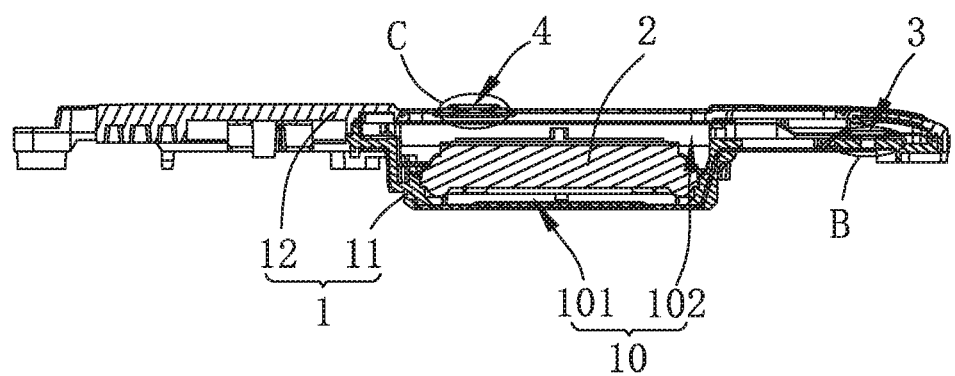
FIG. 6 is a cross-sectional view taken along line A-A in FIG. 1.
Figure 7:
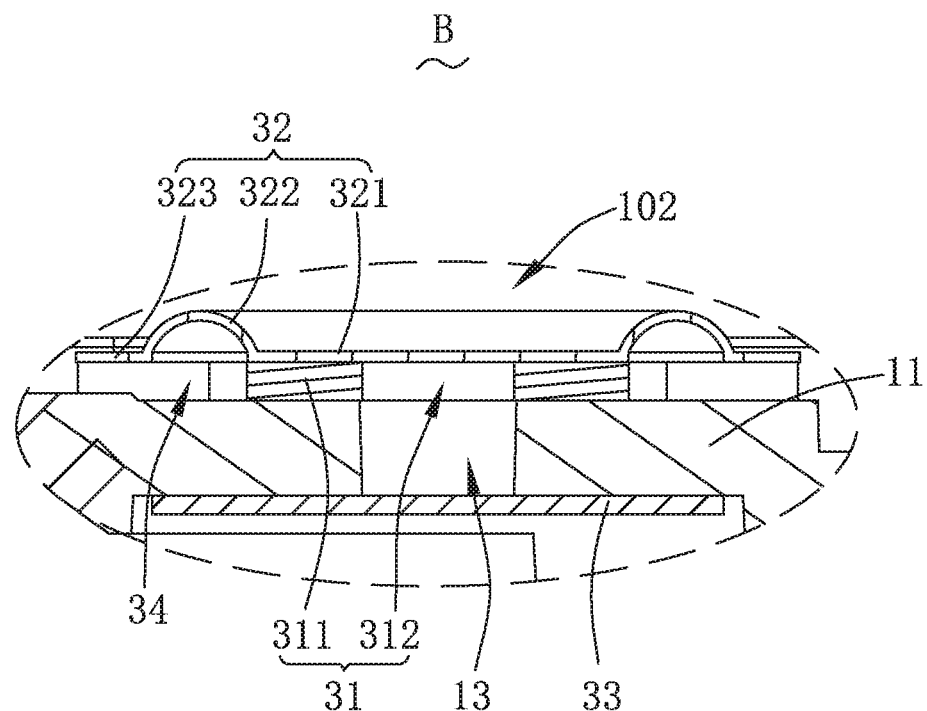
FIG. 7 is an enlarged view of part B shown in FIG. 6.
Figure 8:
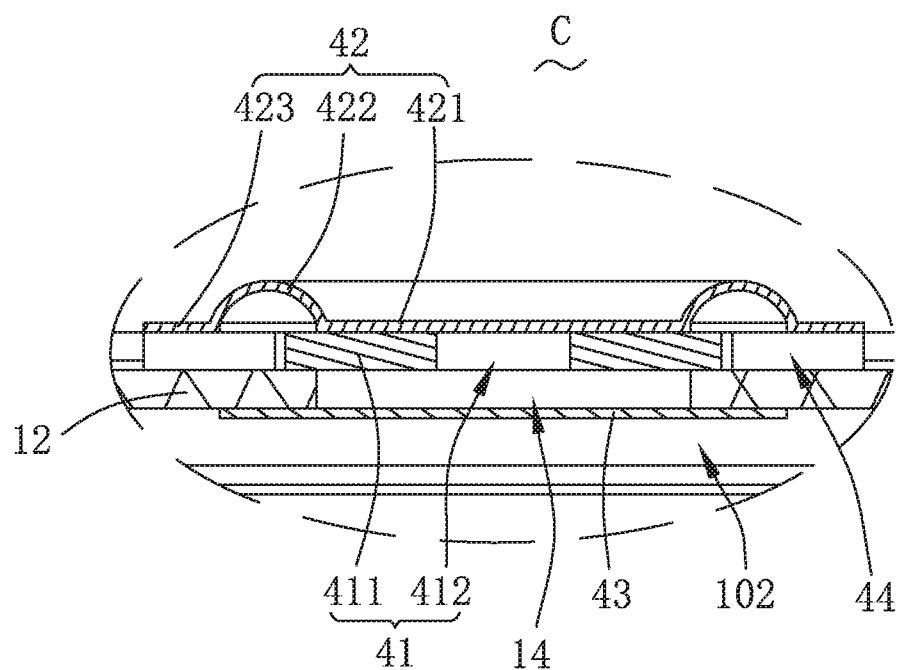
FIG. 8 is an enlarged view of part C shown in FIG. 6.

Referring to FIGS. 1-8, the invention provides a sounding device 100, which comprises a housing body 1, a speaker unit 2, a one-way inlet valve 3 and a one-way outlet valve 4.

The housing body 1 is provided with an accommodating space 10. A sound channel 5 for sounding is formed in the housing body 1.

The speaker unit 2 is assembled in the accommodating space 10 of the housing body 1. The speaker unit 2 partitions the accommodating space 10 into a front cavity 101 and a back cavity 102. Specifically, the speaker unit 2 comprises a diaphragm 21. The diaphragm 21 partitions the accommodating space 10 into a front acoustic cavity 6 and a back cavity 102. The sound channel 5 communicates with the front acoustic cavity 6 and forms the front cavity 101 together with the front acoustic cavity.

In the embodiment, the housing body 1 comprises an upper cover 11 and a lower cover 12 covering the upper cover 11 and defining the accommodating space 10 together with the upper cover. The speaker unit 2 and the upper cover 11 define the front cavity 101. The speaker unit 2, the upper cover 11 and the lower cover 12 cooperatively define the back cavity 102, wherein the front cavity 101 is used for sounding and the back cavity 102 is used for improving the low-frequency acoustic performance.

A first through hole 13 communicating the outside and the back cavity 102, and a second through hole 14 communicating the outside and the back cavity 102 are formed in the housing body 1. For example, the first through hole 13 is formed in the upper cover 11 and the second through hole 14 is formed in the lower cover 12.

The one-way inlet valve 3 is fixed on the housing body 1. The one-way inlet valve 3 communicates the outside and the back cavity 102 and is used for introducing air into the back cavity 102 when the volume of the back cavity 102 is increased through vibration of the diaphragm 21.

The one-way outlet valve 4 is fixed on the housing body 1. The one-way outlet valve 4 communicates the back cavity 102 and the outside and is used for discharging the air in the back cavity 102 outside when the volume of the back cavity 102 is reduced through the vibration of the diaphragm 21.

In the structure, air pressure in the back cavity 102 changes through up and down vibration of the diaphragm 21, so that the air outside the sounding device 100 enters the back cavity 102 through the one-way inlet valve 3, and then is discharged out of the back cavity 102 through the one-way outlet valve 4, so as to form air circulation.

In the embodiment, the one-way inlet valve 3 comprises a first bracket 31, a first diaphragm 32 and a first breathable member 33.

The first bracket 31 is fixed at an inner side of the housing body 1 and completely covers the first through hole 13. Specifically, the first bracket 31 comprises a first bracket body 311 fixed at the inner side of the housing body 1, and a first air channel 312 and second air channels 313 penetrating through the first bracket body 311 respectively.

The first air channel 312 communicates with the first through hole 13 and communicates with the outside through the first through hole 13. More preferably, the first air channel 312 is arranged directly opposite to the first through hole 13, so that the ventilation effect is better.

The second air channels 313 are arranged around the first air channel 312 at intervals, the second air channels 313 extend to the periphery of the first bracket body 311 and the second air channels 313 communicate with the back cavity 102. That is, the second air channels 313 extend from the periphery of the first bracket body 311 to a direction close to the first air channel 312, for example, the second air channels 313 are U-shaped openings. In the embodiment, four second air channels 313 are included and are arranged at equal intervals, certainly, the number and shapes thereof are not limited herein.

The first diaphragm 32 is attached to one side, far away from the first through hole 13, of the first bracket 31. Specifically, the first diaphragm 32 comprises a first vibration part 321, a first folded ring part 322 extending from the periphery of the first vibration part 321, and a first fixation part 323 diffusing and extending outwards from one end, far away from the first vibration part 321, of the first folded ring part 322.

The first vibration part 321 covers the first air channel 312 and can cover one part of the second air channels 313 at the same time. The first vibration part 321 can move up and down relative to the first bracket body 311, and defines an intake space together with the first bracket body when moving to be spaced apart from the first bracket body 311. Moving up and down means moving along an axial direction of the first through hole 13.

The first folded ring part 322 is used for providing an elastic restoring force and a vibration amplitude. That is, when the first vibration part 321 moves far away from the first bracket body 311 upwards, the vibration amplitude is provided by the elastic property of the first folded ring part 322 and the intake space is opened and formed; after movement is ended, the first folded ring part 322 restores elastic deformation to generate the elastic restoring force, so that the first vibration part 321 restores into being attached to the first bracket body 311, and the intake space is closed and disappears. In the embodiment, the cross section of the first folded ring part 322 is of an arc-shaped structure recessed in the direction far away from the first bracket body 311, so that, in a static state, the first vibration part 321 is attached to the first bracket body 311, and the first vibration part and first fixation part 323 are positioned in the same plane.

The first fixation part 323 is attached to and fixed on the periphery of the first bracket body 311, covers one part of the second air channels 313, and specifically covers one ends, far away from the first air channel 312, of the second air channels 313. Due to the structure, the first fixation part 323, the second air channels 313 and the housing body 1 cooperatively define an air inlet passage 34 communicating the back cavity 102 and the intake space. The first air channel 312 communicates the intake space and the first through hole 13.

More preferably, an orthographic projection of the first folded ring part 322 in the direction of the first bracket body 311 partially falls into the second air channels 313. Through the structural design, the communication reliability of the intake space and the air inlet passage 34 when the sounding device 100 works is improved.

The first breathable member 33 is fixed at an outer side of the housing body 1. The first breathable member 33 completely covers the first through hole 13. The first breathable member 33 is used for adjusting the intake air quantity of the first through hole 13, and simultaneously can prevent a foreign matter from entering the back cavity 102 to affect the acoustic performance thereof, so as to improve the reliability. For example, the first breathable member 33 is a mesh cloth, a damping mesh, a breathable isolation film and the like.

In the embodiment, the one-way outlet valve 4 and the one-way outlet valve 3 are the same in physical structure, but reverse in installation and working principles. Specifically, the one-way outlet valve 4 comprises a second bracket 41, a second diaphragm 42 and a second breathable member 43.

The second bracket 41 is fixed at the outer side of the housing body 1 and completely covers the second through hole 14. Specifically, the second bracket 41 comprises a second bracket body 411 fixed at the outer side of the housing body 1, and a third air channel 412 and fourth air channels 413 penetrating through the second bracket body 411 respectively.

The third air channel 412 communicates with the second through hole 14, and communicates with the outside through the second through hole 14. More preferably, the third air channel 412 is arranged directly opposite to the second through hole 14, so that the ventilation effect is better.

The fourth air channels 413 are arranged around the third air channel 412 at intervals, the fourth air channels 413 extend to the periphery of the second bracket body 411, and the fourth air channels 413 communicate with the outside. This is, the fourth air channels 413 extend from the periphery of the second bracket body 411 to the direction close to the third air channel 412. For example, the fourth air channels 413 are U-shaped openings. In the embodiment, four fourth air channels 413 are included and are arranged at equal intervals, certainly, the number and shapes thereof are not limited herein.

The second diaphragm 42 is attached to one side, far away from the second through hole 14, of the second bracket 41. Specifically, the second diaphragm 42 comprises a second vibration part 421, a second folded ring part 422 extending from the periphery of the second vibration part 421, and a second fixation part 423 diffusing and extending outwards from one end, far away from the second vibration part 421, of the second folded ring part 422.

The second vibration part 421 covers the third air channel 412, and simultaneously can cover one part of the fourth air channels 413. The second vibration part 421 can move up and down relative to the second bracket body 1411 and defines an exhale space together with the second bracket body when moving to be spaced apart from the second bracket body 411. Moving up and down means moving along the axial direction of the second through hole 14.

The second folded ring part 422 is used for providing the elastic restoring force and the vibration amplitude. That is, when the second vibration part 421 moves far away from the second bracket body 411 upwards, the vibration amplitude is provided by the elastic property of the second folded ring part 422, and the exhale space is opened and formed; after movement is ended, the second folded ring part 422 restores elastic deformation to generate the elastic restoring force, so that the second vibration part 421 restores into being attached to the second bracket body 411, and the exhale space is closed and disappears. In the embodiment, the cross section of the second folded ring part 422 is of an arc-shaped structure recessed in the direction far away from the second bracket body 411, so that, in the static state, the second vibration part 421 is attached to the second bracket body 411, and the second vibration part and second fixation part 423 are positioned in the same plane.

The second fixation part 423 is attached to and fixed on the periphery of the second bracket body 411, covers one part of the fourth air channels 413, and specifically covers one ends, far away from the third air channel 412, of the fourth air channels 413. Due to the structure, the second fixation part 423, the fourth air channels 413 and the housing body 1 cooperatively define an air outlet passage 44 communicating the back cavity 102 and the exhale space. The third air channel 412 communicates the exhale space and the second through hole 14.

More preferably, the orthographic projection of the second folded ring part 422 in the direction of the second bracket body 411 partially falls into the fourth air channels 413. Through the structural design, the communication reliability of the intake space and the air outlet passage 44 when the sounding device 100 works is improved.

The second breathable member 43 is fixed at the outer side of the housing body 1. The second breathable member 43 completely covers the second through hole 14. The second breathable member 43 is used for adjusting the intake air quantity of the second through hole 14. For example, the second breathable member 43 is the mesh cloth, the damping mesh, the breathable isolation film and the like.

More preferably, in the embodiment, the first through hole 13 is formed in the upper cover 11 and the second through hole 14 is formed in the lower cover 12. Due to the structure, an air path between the one-way intake valve 3 assembled in the first through hole 13 and the one-way outlet valve 4 assembled in the second through hole 14 is longer, thereby achieving a better air circulation effect.

The working principle of the one-way intake valve 3 is as follows: when the diaphragm 21 moves upwards (the diaphragm 21 moves far away from the back cavity 102), the volume of the back cavity 102 is increased, the first vibration part 321 of the first diaphragm 32 floats upwards in the direction far away from the first bracket 31, and the intake space in an open state is formed between the first vibration part 321 and the first bracket 31, external air sequentially passes through the first through hole 13 and the first air channel 312, is drawn into the intake space and then enters the back cavity 102 through the air inlet passage 34; and when the diaphragm 21 moves downwards, the first vibration part 321 restores into an initial state, and meanwhile, the pressure in the back cavity 102 is increased, so that the first vibration part 321 is propped against the first bracket 31 and covers the first air channel 312 to form a seal.

The working principle of the one-way outlet valve 4 is reverse to that of the one-way outlet valve 4: when the diaphragm 21 moves downwards (the diaphragm 21 moves close to the back cavity 102), the volume of the back cavity 102 is increased, the pressure is increased, the air in the back cavity 102 flows to the one-way outlet valve 4 through extrusion, the second vibration part 421 of the second diaphragm 42 floats upwards in the direction far away from the second bracket 41, the exhale space in the open state is formed between the second vibration part 421 and the second bracket 41, the air in the back cavity sequentially passes through the second through hole 14 and the third air channel 412, is discharged into the exhale space and then is discharged outside through the air outlet passage 44; and when the diaphragm 21 moves upwards, the second vibration part 421 restores into the initial state, and meanwhile, the pressure in the back cavity 102 is reduced to form negative pressure, so that the second vibration part 421 is propped against the second bracket 31 and covers the third air channel 412 to form the seal.

The invention further provides a mobile terminal (not shown). The mobile terminal comprises a housing with a containment space, and the sounding device 100, provided by the invention, assembled in the housing.

An air inlet and an air outlet, which penetrate through the housing and separately communicate the containment space and the outside are formed in the housing. The one-way inlet valve communicates the containment space and the back cavity. The external air enters the containment space through the air inlet and then enters the back cavity through the one-way inlet valve. The one-way outlet valve communicates the back cavity and the air outlet, and the air in the back cavity is discharged to the air outlet through the one-way outlet valve to be discharged outside.

When the mobile terminal works, components therein generate a great amount of heat, and the volume of the back cavity 102 is changed through the vibration of the diaphragm 21; when the diaphragm 21 moves upwards (the diaphragm 21 moves far away from the back cavity 102), the volume of the back cavity 102 is increased, external cold air enters the containment space from the air inlet, takes away one part of heat after passing through various components and is heated to hot air, and the hot air is drawn into the back cavity 102 through the one-way inlet valve 3; when the diaphragm 21 moves downwards (the diaphragm 21 moves close to the back cavity 102), the volume of the back cavity 102 is reduced, the hot air in the back cavity 102 flows to the one-way outlet valve 4 through extrusion, and is discharged to the air outlet through the one-way outlet valve 4 to be discharged outside, thereby forming air circulation and achieving the target of heat dissipation.

Compared with the related art, in the sounding device and the mobile terminal of the invention, a one-way inlet valve is arranged to communicate the outside and a back cavity of the sounding device and is used for introducing air into the front cavity; a one-way outlet valve is arranged to communicate the back cavity of the sounding device and the outside and is used for discharging the air in the back cavity to the outside; positive pressure and negative pressure are generated when a sound is made through vibration of the sounding device; and the air is drawn into the mobile terminal through an air inlet, is heated through components in the mobile terminal and then is discharged from the one-way outlet valve, thereby forming air circulation, facilitating internal cooling of the mobile terminal under the condition of not requiring an additional heat dissipation device, and improving the working performance and the stability.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A sounding device, comprising:
a housing body with an accommodating space;
a speaker unit accommodated in the accommodating space;
a one-way inlet valve and a one-way outlet valve fixed on the housing body; wherein
the speaker unit comprises a diaphragm for partitioning the accommodating space into a front cavity and a back cavity;
the one-way inlet valve communicates the outside and the back cavity for introducing air into the back cavity when the volume of the back cavity is increased through vibration of the diaphragm;
the one-way outlet valve communicates with the back cavity and the outside for discharging the air in the back cavity outside when the volume of the back cavity is reduced through the vibration of the diaphragm;
a first through hole communicating with the outside and the back cavity is formed in the housing body; the one-way inlet valve comprises a first bracket fixed at an inner side of the housing body and completely covering the first through hole, and a first diaphragm attached to one side, far away from the first through hole with respect to the first bracket;
the first bracket comprises a first bracket body fixed at the inner side of the housing body, and a first air channel and second air channels penetrating through the first bracket body respectively; the first air channel communicates with the first through hole; the second air channels are arranged around the first air channel at intervals; the second air channels extend to the periphery of the first bracket body and communicate with the back cavity;

the first diaphragm comprises a first vibration part capable of moving up and down relative to the first bracket body and defining an intake space together with the first bracket body when moving to be spaced apart from the first bracket body, a first folded ring part extending from the periphery of the first vibration part, and a first fixation part diffusing and extending outwards from one end, far away from the first vibration part with respect to the first folded ring part; the first fixation part is attached to and fixed on the first bracket body and covers one part of the second air channels; the first fixation part, the second air channels and the housing body cooperatively define an air inlet passage communicating with the back cavity and the intake space; and the first air channel communicates with the intake space and the first through hole.

2. The sounding device as described in claim 1, wherein a cross section of the first folded ring part is of an arc-shaped structure depressed in a direction far away from the first bracket body.

3. The sounding device as described in claim 2, wherein an orthographic projection of the first folded ring part in the direction of the first bracket body partially falls into the second air channels.

4. The sounding device as described in claim 1, wherein the first vibration part is arranged directly opposite to the first air channel; the first air channel is arranged directly opposite to the first through hole; and four second air channels are included and are arranged at equal intervals.

5. The sounding device as described in claim 1, wherein the one-way inlet valve further comprises a first breathable member fixed at an outer side of the housing body; and the first breathable member completely covers the first through hole.

6. The sounding device as described in claim 1, wherein a second through hole communicating the outside and the back cavity is also formed in the housing body; the one-way outlet valve comprises a second bracket fixed at the outer side of the housing body and completely covering the second through hole, and a second diaphragm attached to one side, far away from the second through hole with respect to the second bracket; the second bracket comprises a second bracket body fixed at the outer side of the housing body, and a third air channel and fourth air channels penetrating through the second bracket body respectively; the third air channel communicates with the second through hole; the fourth air channels are arranged around the third air channel at intervals; the fourth air channels extend to the periphery of the second bracket body and communicate with the outside; the second diaphragm comprises a second vibration part capable of moving up and down relative to the second bracket body and defining an exhale space together with the second bracket body when moving to be spaced apart from the second bracket body, a second folded ring part extending from the periphery of the second vibration part, and a second fixation part diffusing and extending outwards from one end, far away from the second vibration part with respect to the second folded ring part; the second fixation part is attached to and fixed on the periphery of the second bracket body and covers one part of the fourth air channels; the second fixation part, the fourth air channels and the housing body cooperatively define an air outlet passage communicating with the exhale space and the outside; and the third air channel communicates with the exhale space and the second through hole.

7. The sounding device as described in claim 6, wherein a cross section of the second folded ring part is of an arc-shaped structure depressed in the direction far away from the second bracket body.

8. The sounding device as described in claim 7, wherein an orthographic projection of the second folded ring part in the direction of the second bracket body partially falls into the fourth air channels.

9. The sounding device as described in claim 6, wherein the second vibration part is arranged directly opposite to the third air channel; the third air channel is arranged directly opposite to the second through hole; and four fourth air channels are included and are arranged at equal intervals.

10. The sounding device as described in claim 6, wherein the one-way outlet valve further comprises a second breathable member fixed at the inner side of the housing body; and the second breathable member completely covers the second through hole.

11. The sounding device as described in claim 6, wherein the housing body comprises an upper cover and a lower cover covering the upper cover and defining the accommodating space together with the upper cover; the speaker unit and the upper cover define the front cavity; the speaker unit, the upper cover and the lower cover cooperatively define the back cavity; the first through hole is formed in the upper cover; and the second through hole is formed in the lower cover.

12. A mobile terminal, comprising a housing with a containment space and a sounding device as described in claim 1 assembled in the housing, wherein an air inlet and an air outlet, which penetrate through the housing and separately communicate with the containment space and the outside are formed in the housing; the one-way inlet valve communicates with the containment space and the back cavity; and the one-way outlet valve communicates with the back cavity and the air outlet.

* * * * *